United States Patent
Mytkowicz et al.

(10) Patent No.: US 10,922,620 B2
(45) Date of Patent: Feb. 16, 2021

(54) MACHINE LEARNING THROUGH PARALLELIZED STOCHASTIC GRADIENT DESCENT

(71) Applicant: Microsoft Technology Licensing, LLC, Redmond, WA (US)

(72) Inventors: Todd Mytkowicz, Redmond, WA (US); Madanlal Musuvathi, Redmond, WA (US); Yufei Ding, Raleigh, NC (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 976 days.

(21) Appl. No.: 15/006,892

(22) Filed: Jan. 26, 2016

(65) Prior Publication Data
US 2017/0213148 A1  Jul. 27, 2017

(51) Int. Cl.
*G06N 20/00* (2019.01)
*G06F 30/00* (2020.01)

(52) U.S. Cl.
CPC ............ *G06N 20/00* (2019.01); *G06F 30/00* (2020.01)

(58) Field of Classification Search
CPC ......... G06N 99/005; G06N 3/02; G06N 5/00; G06N 7/02; G05B 13/00; G06F 17/50
See application file for complete search history.

(56) References Cited

U.S. PATENT DOCUMENTS 8,626,677 B2  1/2014 Chen et al.
8,903,748 B2  12/2014 Gemulla et al.
2011/0295774 A1* 12/2011 Chen .................... G06K 9/6269
                                                        706/12
2013/0325401 A1  12/2013 Bouchard
2014/0164299 A1   6/2014 Sainath et al.
(Continued)

FOREIGN PATENT DOCUMENTS

CN        102750309 A      10/2012

OTHER PUBLICATIONS

Agarwal et al., "A Reliable Effective Terascale Linear Learning System", Journal of Machine Learning 15 (2014) pp. 1111-1133. (Year: 2014).*

(Continued)

*Primary Examiner* — Kakali Chaki
*Assistant Examiner* — Robert Lewis Kulp
(74) *Attorney, Agent, or Firm* — Klarquist Sparkman, LLP

(57) ABSTRACT

Systems, methods, and computer media for machine learning through a symbolic, parallelized stochastic gradient descent (SGD) analysis are provided. An initial data portion analyzer can be configured to perform, using a first processor, SGD analysis on an initial portion of a training dataset. Values for output model weights for the initial portion are initialized to concrete values. Local model builders can be configured to perform, using an additional processor for each local model builder, symbolic SGD analysis on an additional portion of the training dataset. The symbolic SGD analysis uses a symbolic representation as an initial state for output model weights for the corresponding portions of the training dataset. The symbolic representation allows the SGD analysis and symbolic SGD analysis to be performed in parallel. A global model builder can be configured to combine outputs of the local model builders and the initial data portion analyzer into a global model.

20 Claims, 11 Drawing Sheets

(56) References Cited

U.S. PATENT DOCUMENTS

| | | | | |
|---|---|---|---|---|
| 2014/0358825 | A1* | 12/2014 | Phillipps | G06N 99/005 706/11 |
| 2015/0019214 | A1 | 1/2015 | Wang et al. | |
| 2015/0106783 | A1* | 4/2015 | Mytkowicz | G06F 8/22 717/104 |

OTHER PUBLICATIONS

Bergstra et al., "Theano: A CPU and GPU Math Compiler in Python", Proc of the 9th Python in Science Conf (SCIPY 2010), pp. 1-7. (Year: 2010).*

Rayshev et al., "Parallelizing User-Defined Aggregations Using Symbolic Execution", Oct. 4-7, 2015, SOSP 15, Twenty-Fifth ACM Symposium on Operating SYstems Principles, pp. 153-167. (Year: 2015).*

Raychev et al ("Parallelizing User-Defined Aggregations using Symbolic Execution", SOSP'15, Oct. 4-7, 2015, pp.153-167) (Year: 2015).*

Y. Bengio ("Practical Recommendations for Gradient-Based Training of Deep Architectures", arXiv: 1206.5533v2 [cs.LG] Sep. 16, 2012, https://arxiv.org/pdv/1206.5533.pdf, pp. 1-33) (Year: 2012).*

Catak et al. ("CloudSVM: Training an SVM Classifier in Cloud Computing Systems", Joint International Conference on Pervasive Computing and the Network World, ICPCA/SWS 2012, pp. 57-68) (Year: 2012).*

Agrawal et al ("A Reliable Effective Terascale Linear Learning System", Journal of Machine Learning Research 15 (2014), pp. 1111-1133, 2014) (Year: 2014).*

Paul Hippel ("Linear vs. Logistic Probability Models: Which is Better, and When?", Statistical Horizons Blog, https://statisticalhorizons.com/linear-vs-logistic, Archive.org, Sep. 30, 2015, pp. 1-4) (Year: 2015).*

Bergstra et al. ("Theano: A CPU and GPU Math Compiler in Python", Proc. of the 9th Python in Science Conf (SCIPY 2010), 2010, pp. 1-7) (Year: 2010).*

International Search Report and Written Opinion, International Application No. PCT/US2017/013836, 19 pages, dated Apr. 26, 2017.

Agarwall et al., "A Reliable Effective Terascale Linear Learning System," *Journal of Machine Learning Research*, vol. 15, pp. 1111-1133, Mar. 31, 2014.

Raychev et al., "Parallelizing User-Defined Aggregations Using Symbolic Execution," *SOSP '15, Proceedings of the 25th Symposium on Operating Systems Principles*, pp. 153-167, Oct. 4, 2015.

Maleki et al., "Parallel Stochastic Gradient Descent with Sound Combiners," https://openreview.net/references/pdf?id=rkIa54CGg, 12 pages, Dec. 2, 2016 (retrieved on Apr. 10, 2017).

Oh, et al., "Fast and Robust Parallel SGD Matrix Factorization", In Proceedings of 21th ACM SIGKDD International conference on Knowledge Discovery and Data Mining, Aug. 10, 2015, pp. 865-874.

Mahajan, et al., "A Parallel SGD method with Strong Convergence", In Journal of Computing Research Repository, Nov. 2013, pp. 1-5.

Smola, Alex, "Parallel Stochastic Gradient Descent", Published on: Sep. 2, 2010 Available at: http://blog.smola.org/post/977927287/parallel-stochastic-gradient-descent.

Zhao, et al., "Fast Asynchronous Parallel Stochastic Gradient Decent", Published on: Aug. 25, 2015 Available at: http://arxiv.org/pdf/1508.05711v1.pdf.

Do, Thanh-Nghi, "Parallel Multiclass Stochastic Gradient Descent Algorithms for Classifying Million Images with Very-High-Dimensional Signatures into Thousands Classes", In Vietnam Journal of Computer Science, vol. 1, Issue 2, Jan. 21, 2014, pp. 107-115.

Keuper, et al., "Asynchronous Parallel Stochastic Gradient Descent—A Numeric Core for Scalable Distributed Machine Learning Algorithms", In Journal of Computing Research Repository, May 2015, 11 pages.

Qin, et al., "Lightning-Fast, Dirt-Cheap Parallel Stochastic Gradient Descent for Big Data in GLADE", In Proceedings of BayLearn Symposium, Aug. 2013, pp. 1-2.

Zhuang, et al., "A Fast Parallel SGD for Matrix Factorization in Shared Memory Systems", In Proceedings of 7th ACM conference on Recommender systems, Oct. 12, 2013, 8 pages.

Tata, Sandeep, "Parallel Stochastic Gradient Descent", Published on: Sep. 20, 2011 Available at: http://sandeeptata.blogspot.in/2011/09/parallel-stochastic-gradient-descent.html.

Anderson, et al., "Lapack: A Portable Linear Algebra Library for High-Performance Computers", In Proceedings of ACM/IEEE Conference on Supercomputing, Oct. 1, 1990, pp. 2-11.

Joyner, et al., "Open Source Computer Algebra Systems: SymPy", In Journal of ACM Communications in Computer Algebra, vol. 45, No. 4, Sep. 2011, pp. 225-234.

Langford, et al., "Slow Learners are Fast", In Proceedings of 23rd Annual Conference on Neural Information Processing Systems, Dec. 7, 2009, pp. 1-9.

Li, et al., "Scaling Distributed Machine Learning with the Parameter Server", In Proceedings of 11th USENIX Symposium on Operating Systems Design and Implementation, Oct. 6, 2014, pp. 1-16.

Recht, et al., "Hogwild!: A Lock-Free Approach to Parallelizing Stochastic Gradient Descent", In Proceedings of 25th Annual Conference on Neural Information Processing Systems, Dec. 12, 2011, pp. 1-9.

Zinkevich, et al., "Parallelized Stochastic Gradient Descent", In Proceedings of 24th Annual Conference on Neural Information Processing Systems, Dec. 6, 2010, pp. 1-36.

NG, "CS229 Lecture Notes," CS229 Fall 2012, 30 pages (accessed Nov. 17, 2015).

* cited by examiner

MACHINE LEARNING THROUGH PARALLELIZED STOCHASTIC GRADIENT DESCENT

BACKGROUND

Machine learning is increasingly being used to understand and characterize large datasets. Through various approaches, machine learning typically enables relationships to be understood by analyzing known training data and formulating models or equations consistent with the training data. These models can then be applied to analyze new data.

Despite recent increases in processing power, memory, and other computing capabilities, machine learning is typically resource intensive and slow. Various approaches have been attempted to compensate for these deficiencies, including using multiple computers processing in parallel to speed up training. Parallel processing, however, is difficult to perform accurately for inherently sequential machine learning approaches.

SUMMARY

Examples described herein relate to machine learning systems configured to perform parallelized stochastic gradient descent (SGD). An initial data portion analyzer can be configured to perform, using a first processor, SGD analysis on an initial portion of a training dataset. The SGD analysis includes initializing values for a set of output model weights for the initial portion of the training dataset. A local model builder can be configured to perform, using a second processor, symbolic SGD analysis on an additional portion of the training dataset. The symbolic SGD analysis includes using a symbolic representation as an initial state of a set of output model weights for the additional portion of the training dataset. The initial data portion analyzer and the local model builder are configured to perform the SGD analysis and symbolic SGD analysis in parallel. A global model builder can be configured to integrate an output of the local model builder and an output of the initial data portion analyzer into a global model that reflects both the initial portion and the additional portion of the training dataset.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

The foregoing and other objects, features, and advantages of the claimed subject matter will become more apparent from the following detailed description, which proceeds with reference to the accompanying figures.

DETAILED DESCRIPTION

Using the systems, methods, and computer-readable media described herein, machine learning can be performed using a parallelized stochastic gradient descent (SGD) analysis. SGD is a machine learning approach with favorable convergence properties that also scales to large data. However, when training data is stored on disk, which is typically true for large datasets, training is limited by the speed with which data can be read. Because of the sequential nature of SGD analysis, parallel computing approaches that might be applicable to other machine learning approaches are typically not available to increase speed in SGD analysis.

The examples described herein use a symbolic approach to SGD analysis that maintains the accuracy of the inherently sequential SGD while allowing the data to be distributed to multiple machines (or multiple processors or processor cores) for parallel processing. Training data can be divided into multiple portions, and individual machines or processors can process a data portion in parallel. In a conventional SGD analysis, an initial state of output model weights is known for each data portion because the data is being processed sequentially, and the results for the previous data portion are thus available. In a parallel processing scenario, however, results for the previous portion are not available. The described examples allow parallel SGD analysis by using a symbolic representation of an initial state of the output model weights for the different data portions. The symbolic representation allows a local result for the individual data portions to be determined without knowing actual concrete initial states. The local results can subsequently be combined into a global result.

The parallel SGD analysis of the described examples reduces the time necessary to perform machine learning on a given training dataset, providing faster, accurate computation of results. Examples are described below with respect to FIGS. 1-11.

Figure 1:
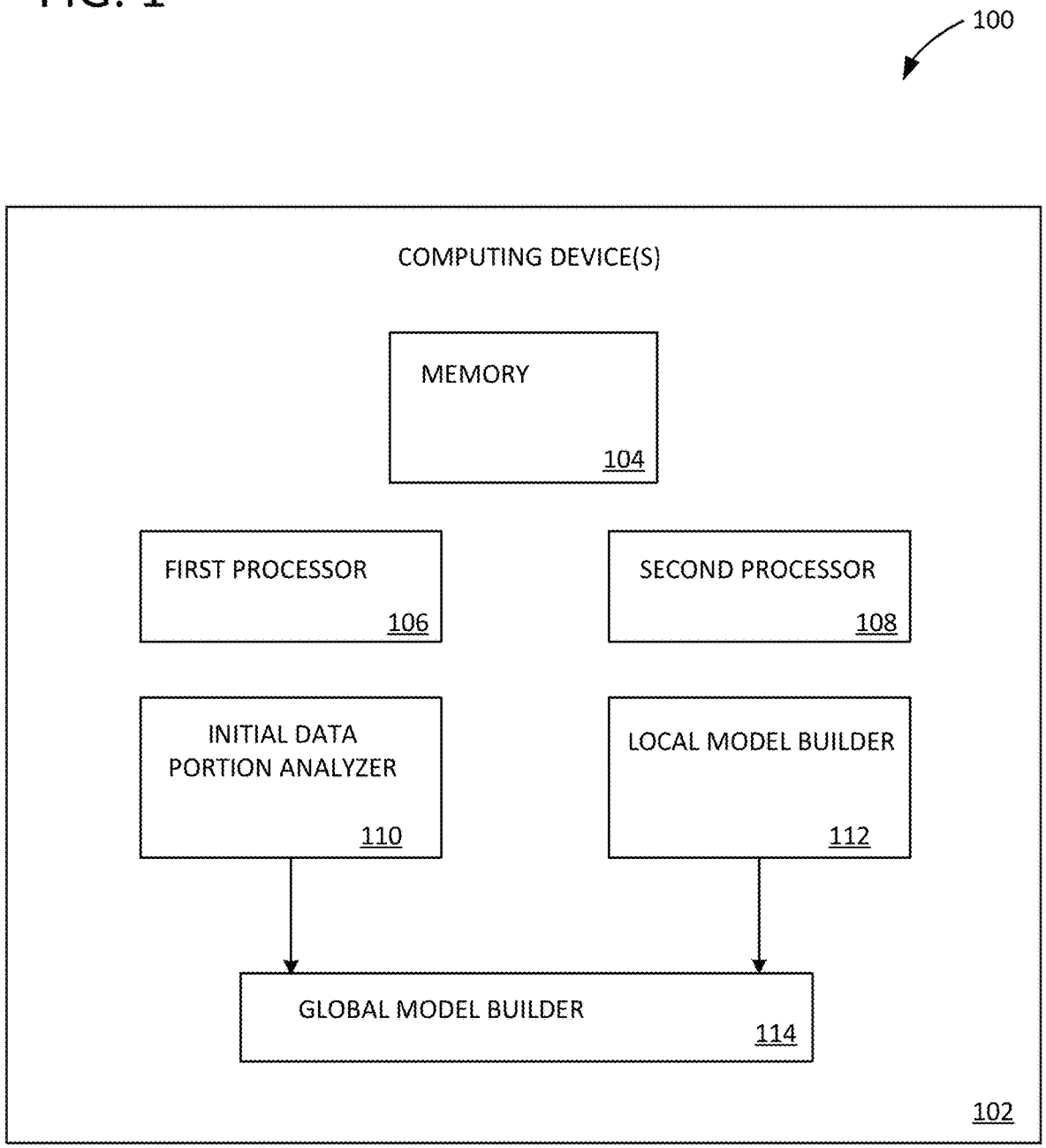
FIG. 1 is a block diagram of an example parallelized SGD machine learning system.

FIG. 1 illustrates a machine learning system 100 implemented on one or more computing device(s) 102. Computing device(s) 102 includes a memory 104, a first processor 106, and a second processor 108. "Processor" can also refer to processor core. Thus, first processor 106 and second processor 108 can be two processor cores on a single processor. Memory 104 can store training data, software instructions, or other data. An initial data portion analyzer 110 is configured to perform, using first processor 106, stochastic gradient descent (SGD) analysis on an initial portion of a training dataset. The SGD analysis comprises initializing values for a set of output model weights for the initial portion of the training dataset. For example, the values can be initialized to concrete (numeric) values.

SGD analysis is a type of gradient descent (GD) analysis that can be used to solve "minimization problems." Many problems in statistical estimation and regression can be cast as risk minimization problems. To identify trends and associations in data, a "best" fitting curve from a family of curves is sought to filter the noise from signals. As used herein, "best" refers to maximizing a likelihood. Consider, for example, ordinary least squares (OLS) regression. OLS regression amounts to finding the line, or more generally, the plane, with minimal total Euclidean distance to the data points. In other words, the plane that minimizes the distance between the data points and their orthogonal projections onto the plane is sought. Formally, a regression vector w is sought that minimizes the "loss" function $$f(\vec{o}) = \frac{1}{2} \|\vec{y} - X\vec{w}\|^2. \quad (1)$$

where $\vec{y}$ is a vector response variables and X is the data matrix (n examples in the k-feature space).

To solve this kind of minimization problem, one way is to use iterative gradient methods: at each step, the gradient of the loss function based on all date points is computed, and the parametric vector w is moved along the direction of the gradient. SGD typically has lower computational complexity and faster convergence speed than GD. Compared to GD, SGD uses one point to compute a "local gradient," and the parametric vector is moved along that direction. SGD often converges within just one iteration over all training examples. Batch GD, in comparison, will have only completed one iteration, with more iterations to come. SGD does not require movement in the best direction every time, but instead can move any potentially good direction in a much faster manner. As discussed above, however, SGD is inherently sequential and hence difficult to scale with the growing number of the processors in modern computing systems. Compared to GD, it eliminates the averaging step in computing the gradient descent from all points.

A local model builder 112 is configured to perform, using second processor 108, symbolic SGD analysis on an additional portion of the training dataset. The symbolic SGD analysis comprises using a symbolic representation as an initial state of a set of output model weights for the additional portion of the training dataset. Initial data portion analyzer 110 and local model builder 112 are configured to perform the SGD analysis and symbolic SGD analysis in parallel (using first processor 106 and second processor 108, respectively).

Initial data portion analyzer 110 can be configured to initialize output model weights for the initial portion of the training dataset using concrete values because the initial data portion does not have a dependency on a previous data portion (it is the first data portion). The symbolic representation used as the initial state of output model weights for additional portion(s) of the training dataset allows corresponding additional processors to perform symbolic SGD analysis on respective additional data portions without waiting for completion of the analysis of the previous data portion, thus enabling parallelization. Processing in "parallel" does not imply that the processing performed by different processors is fully coextensive in time. That is, some processors may begin or end sooner or later than others.

A global model builder 114 is configured to integrate an output of local model builder 112 and an output of initial data portion analyzer 110 into a global model that reflects both the initial portion and the additional portion of the training dataset. For example, the output model weights for the different data portions can be combined into a single global model that can include a set of output model weights representing the entire training dataset. The output of local model builder 112 can include a local model representing the output model weights for the additional portion of the training dataset. In some examples, the local model is a vector representation. The output of the local model builder can also include a model combiner indicating how to combine the output from initial data portion analyzer 110 with the local model. In some examples, the model combiner is a matrix representation. Example local models and model combiners are discussed in detail with respect to FIGS. 5 and 6.

In some examples, the local model and/or global models are linear models. The global model can include values for a set of global output model weights. In some examples, the SGD analysis and symbolic SGD analysis are linear regression analyses, although nonlinear SGD analysis and nonlinear symbolic SGD analysis are also contemplated.

Computing device(s) 102 can be a single computing device or multiple computing devices. In some examples, first processor 106 and initial data portion analyzer 110 are part of a first computing device, and second processor 108 and local model builder 112 are part of a second computing device. Global model builder 114 can be part of the first computing device, the second computing device, or can be part of still another computing device. In some examples, first processor 106 is part of a first mobile device, second processor 108 is part of a second mobile device, and global model builder 114 is in the cloud (not shown). In other examples, first processor 106 is part of a first server computer in a data center and second processor 108 is part of a second server computer in the data center.

In some examples, initial data portion analyzer 110 can be configured to perform symbolic SGD analysis similar to local model builder 112, and rather than using concrete initial values to perform SGD analysis, concrete initial values can be combined with an output of symbolic SGD analysis for the initial data portion.

Figure 2:
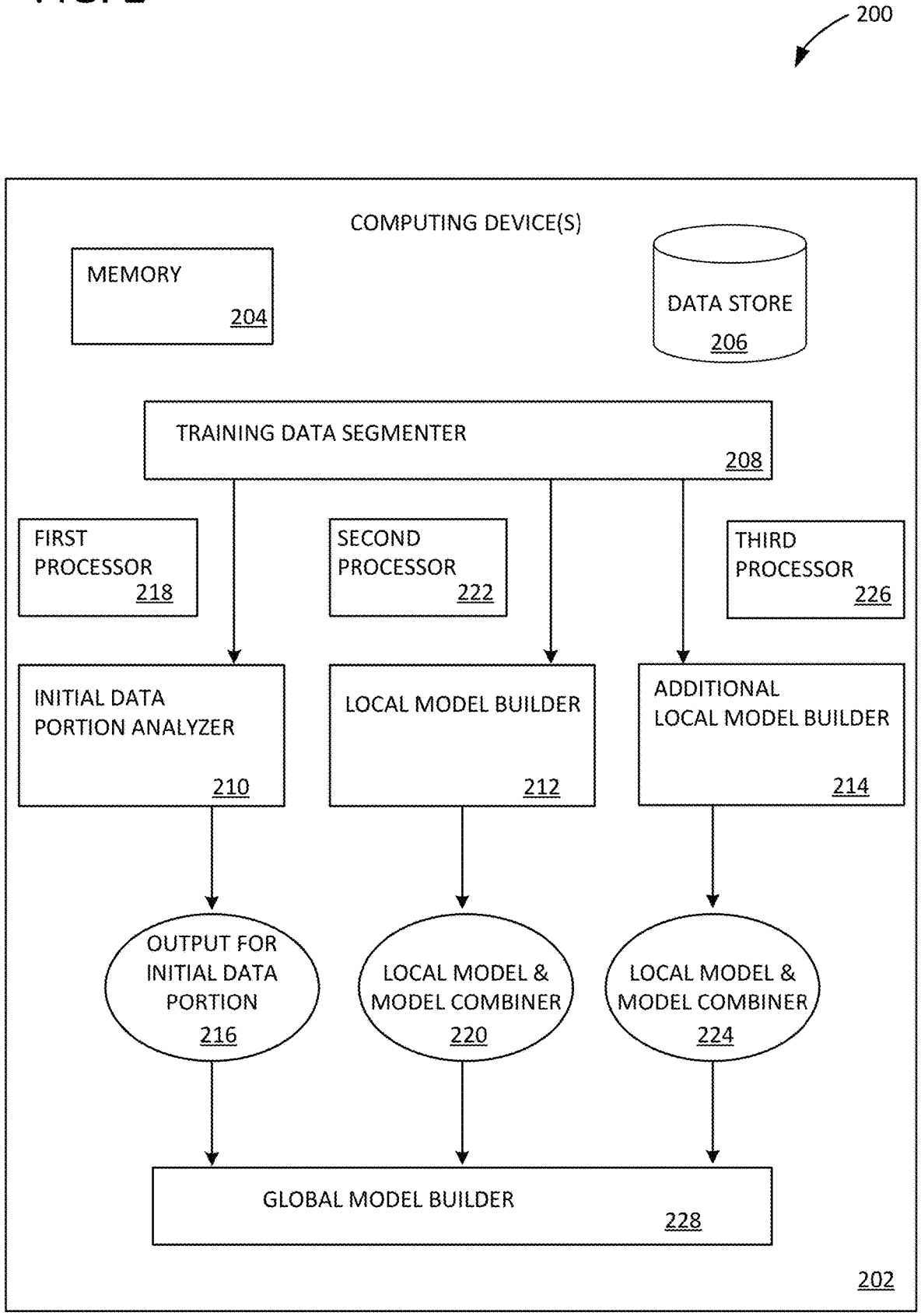
FIG. 2 is a block diagram of an example parallelized SGD machine learning system in which an additional local model builder and third processor are shown.

FIG. 2 illustrates a machine learning system 200 implemented on one or more computing device(s) 202. Computing device(s) 202 includes a memory 204 and a data store 206. Memory 204 can store, for example, software instructions and/or data. Data store 206 can store, for example, a training dataset. A training data segmenter 208 is configured to divide the training dataset into a plurality of portions. The plurality of portions includes an initial portion of the training dataset and one or more additional portions of the training dataset. Training data segmenter 208 is further configured to communicate the initial portion of the training dataset to an initial data portion analyzer 210, communicate an additional portion of the training dataset to a local model builder 212, and communicate a further additional portion of the training dataset to additional local model builder 214. Initial data portion analyzer 210 can be similar to initial data portion analyzer 110 of FIG. 1. Local model builder 212 and additional local model builder 214 can be similar to local model builder 112 of FIG. 1.

Initial data portion analyzer 210 is configured to perform SGD analysis on the initial portion of the training dataset and generate an output 216 for the initial data portion. The SGD analysis is performed by initial data portion analyzer 210 using first processor 218. As was described with respect to FIG. 1, initial values for a set of output model weights for the initial portion of the training dataset are initialized to concrete values. Local model builder 212 is configured to perform symbolic SGD analysis on an additional data portion and to generate a local model and model combiner 220. The symbolic SGD analysis comprises using a symbolic representation as an initial state of a set of output model weights for the additional portion of the training dataset. Local model builder 212 is configured to perform the symbolic SGD analysis, in parallel with the SGD analysis, using second processor 222.

Additional local model builder 214 is configured to perform symbolic SGD analysis, similar to local model builder 212, on a further additional portion of the training dataset and to generate a local model and model combiner 224. Additional local model builder 214 is configured to perform the symbolic SGD analysis, in parallel with the SGD analysis and the symbolic SGD analysis performed by local model builder 212, using third processor 226. global model builder 228 combines output 216 for the initial data portion, local model and model combiner 220, and local model and model combiner 224, into a global model representing the training dataset.

Figure 3:
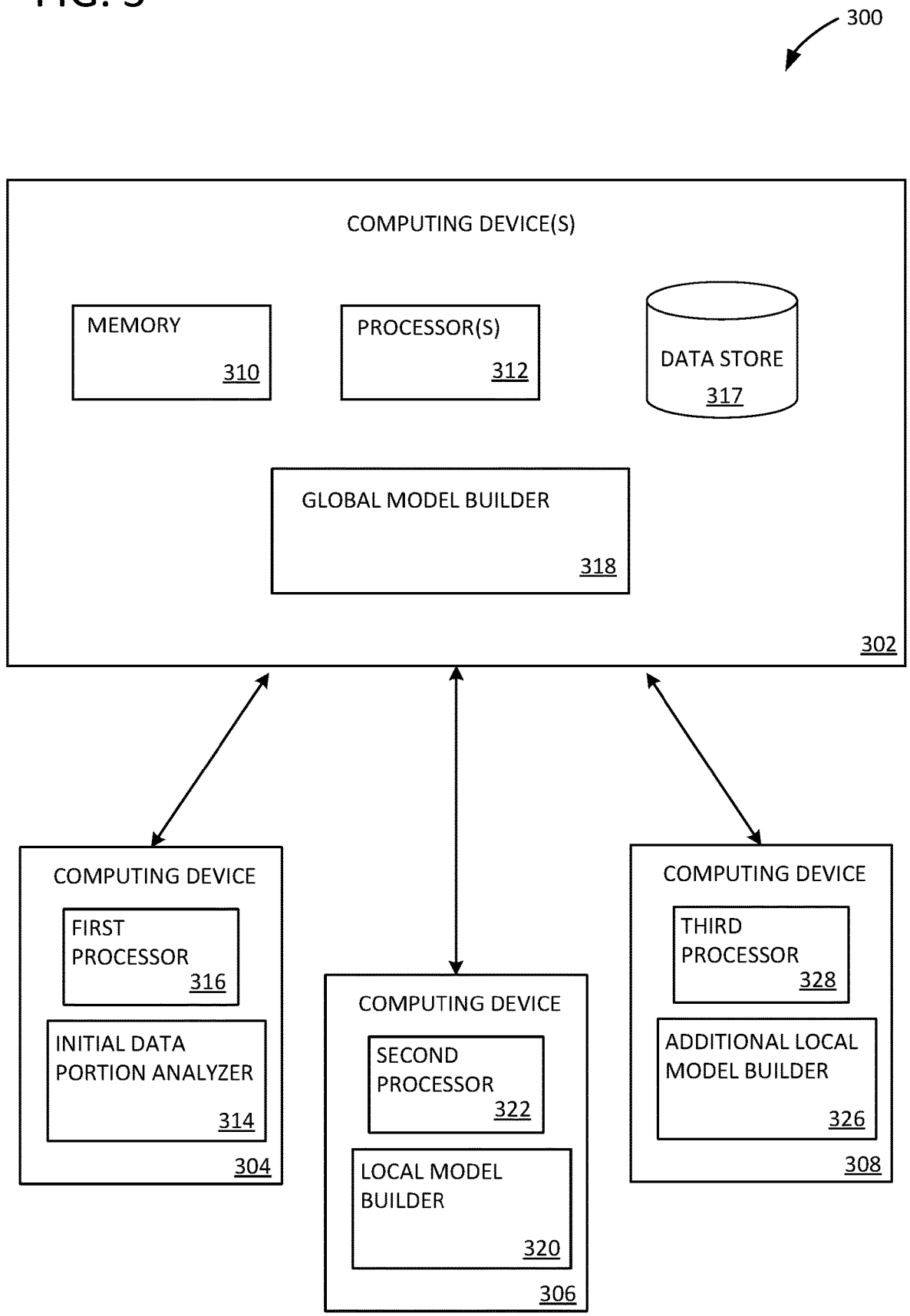
FIG. 3 is a block diagram of an example parallelized SGD machine learning system in which the first, second, and third processors are located on separate computing devices.

FIG. 3 illustrates a system 300 implemented on one or more computing devices 302 as well as computing devices 304, 306, and 308. Computing device 302 includes a memory 310, processor 312, data store 317, and a global model builder 318, which can be similar to global model builder 228 of FIG. 2 and global model builder 114 of FIG. 1. Computing devices 304, 306, and 308 are in communication with computing device 302 over a network, which can be the Internet, a local area network (LAN), a wireless local area network (WLAN), a wide area network (WAN), or other type of network, wired or wireless.

Computing device 304 includes an initial data portion analyzer 314 and a first processor 316; computing device 306 includes a local model builder 320 and a second processor 322; and computing device 308 includes an additional local model builder 326 and a third processor 328. Initial data portion analyzer 314, local model builder 320, and additional local model builder 326 can be similar to the corresponding components in FIGS. 1 and 2. In some examples, computing devices 304, 306, and 308 can be mobile computing devices, and computing device 302 can be one or more servers in the cloud. In such an arrangement, for example, individual mobile devices can each analyze a portion of a training dataset, and a global model can be determined and stored in the cloud for access by a number of users. In other examples, computing devices 302, 304, 306, and 308 can be individual server computers in a datacenter. Customers can provide training data through a web service, for example, and computing devices 302, 304, 306, and 308 can be used to quickly and accurately develop a global model representing the training data and provide the model back to the customers.

Figure 4:
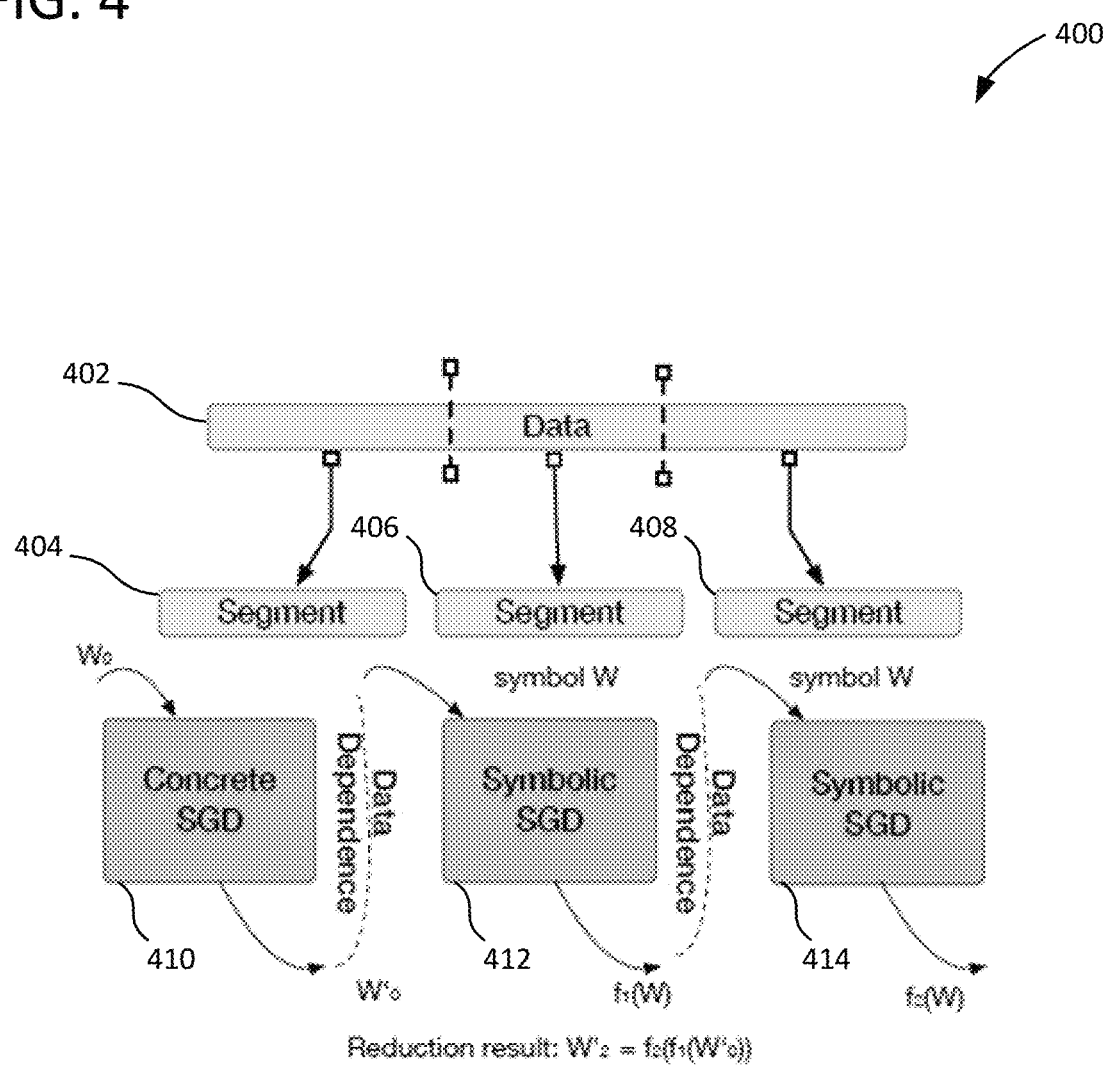
FIG. 4 is a block diagram illustrating the flow and dependence of data in an example parallelized SGD machine learning system.

Segmentation of training data and parallelization of SGD is further illustrated in FIG. 4 by system flow diagram 400. In sequential SGD, for each iteration the update to a decision variable w is computed based on approximation of gradient descent from one randomly selected data point. This process is then repeated on more data points until convergence. A difficulty with implementing sequential SGD in a parallel manner is that for latter machines (except the first machine), the initial state of w is unknown. Randomly starting with any initial w or with the same w for all machines results in the loss of the information obtained from the previous machine. The symbolic execution framework described herein avoids the loss of information from previous machines. While the first machine can start from the initial decision vector w, i.e. [0,0,0], all other machines would instead start with a symbolic vector w, i.e. [x, y, z]. In a symbolic execution, variables contain symbolic expressions and programs manipulate these expressions rather than concrete values. For example, the previous vector w after an update like w+=1 becomes [x+1, y+1, z+1]. Each subsequent machine can create a symbolic function in terms of the input symbolic variable w.

In FIG. 4, a training dataset 402 is divided into segments 404, 406, and 408. Computing devices (also referred to as machines) 410, 412, and 414 receive segments 404, 406, and 408, respectively. Machines 412 and 424 produce symbolic functions $f_1$ (w) and $f_2$ (w). These functions integrate the information from the local data set. As a result, evaluating these summaries for a concrete w does not require rereading the local data set. To get the final result that maintains the same semantics of sequential SGD, these symbolic functions are combined in the right order. As shown in the FIG. 4, a global model $w'_2$ is determined through a reduction of $f_2(f_1(w'_0))$, where $w'_0$ is the output from machine 410 (that was initialized using concrete values). Machine 410 can implement an initial data portion analyzer as shown in FIGS. 1-3, and machines 412 and 414 can implement a local model builder and additional local model builder, respectively, as shown in FIGS. 1-3. Although the examples shown herein illustrate three machines, parallelization is also contemplated among a larger number of machines (e.g., 10, 100, 1000, etc.).

Figure 5:
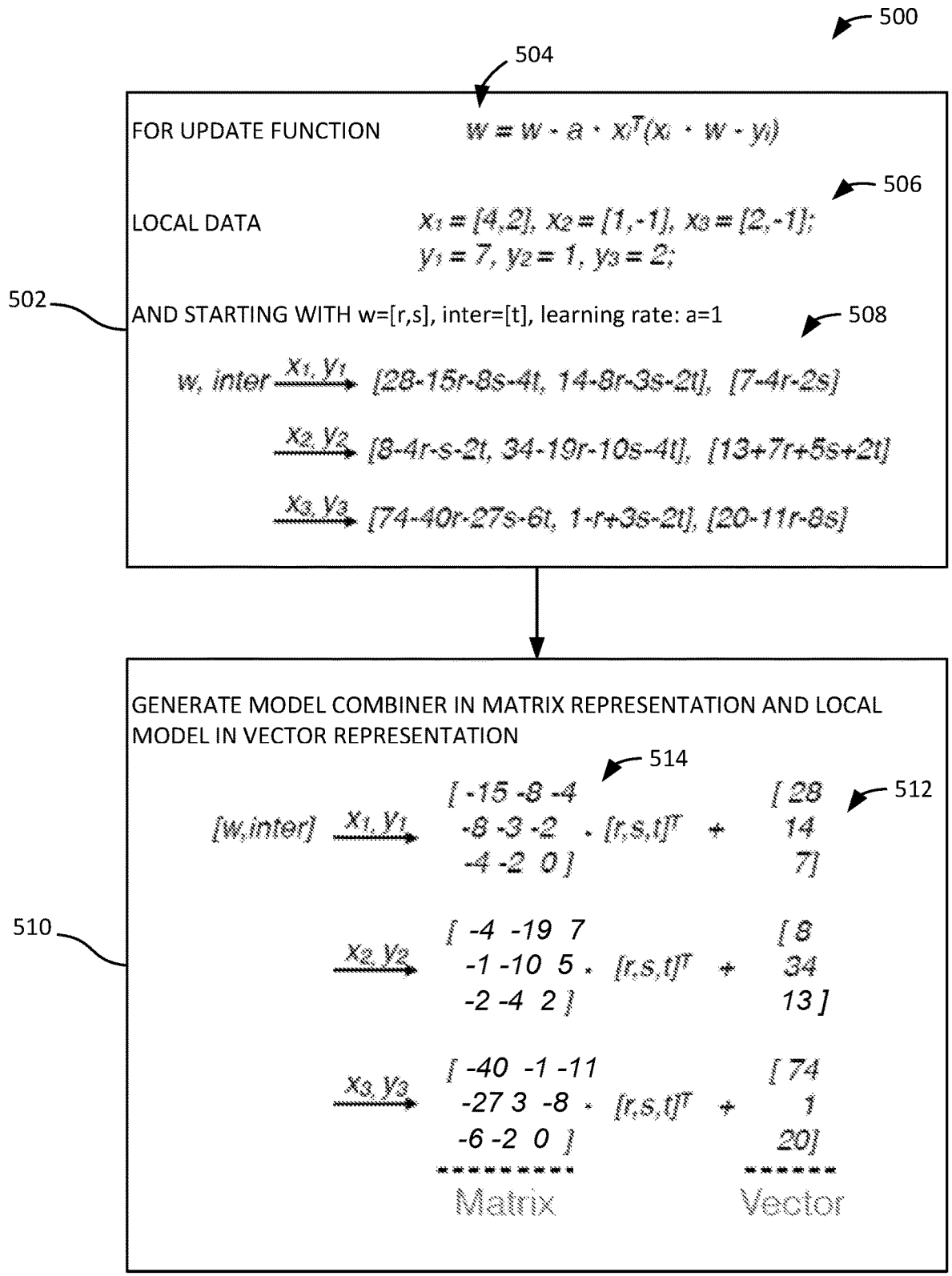
FIG. 5 is a flowchart illustrating an example generation of a local model and a model combiner.
Figure 6:
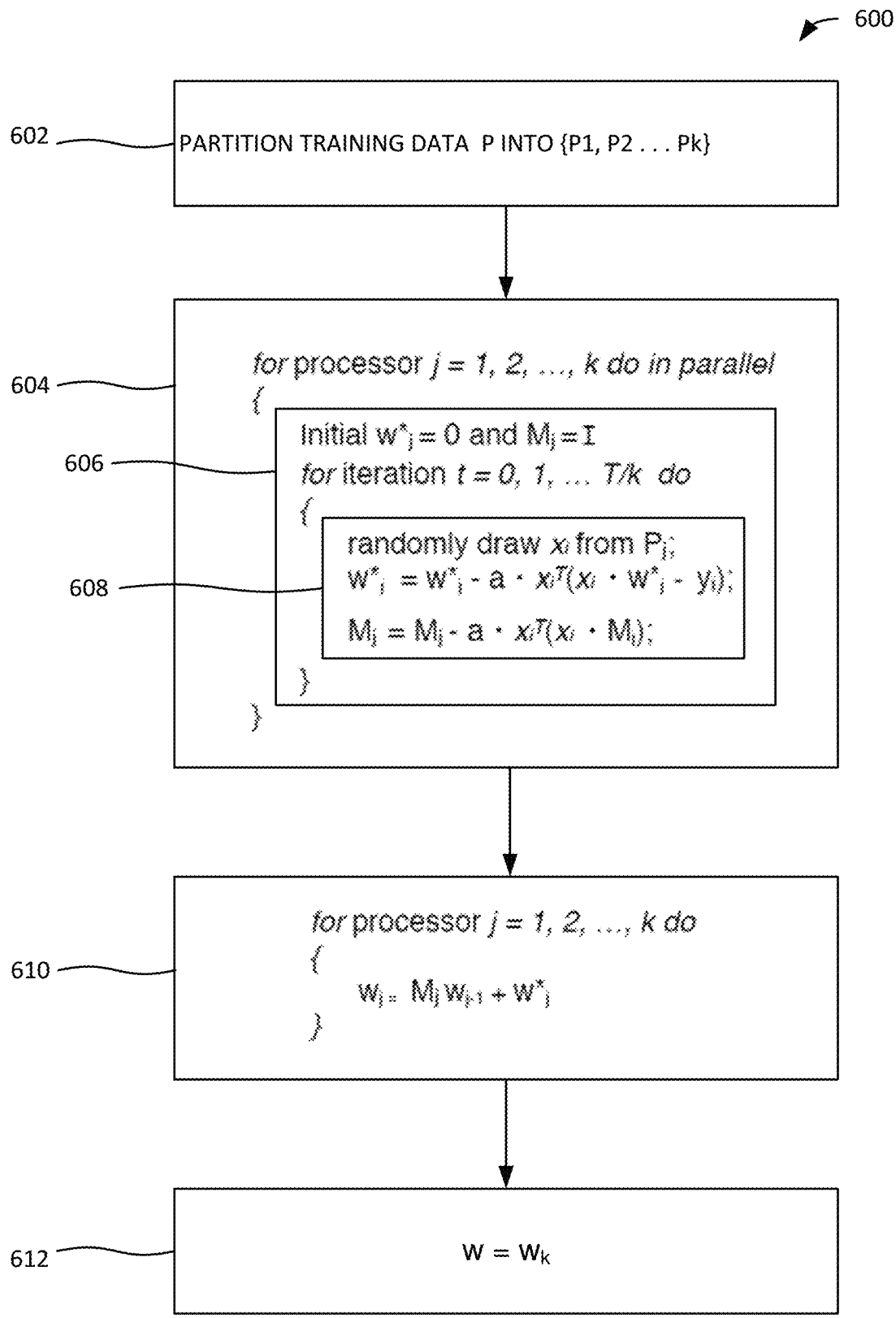
FIG. 6 is a flowchart illustrating an example parallelized SGD method in which the local model and model combiner are initialized.

FIGS. 5 and 6 illustrate further examples of symbolic parallelized SGD analysis. FIG. 5 illustrates a method 500 of determining a local model and model combiner for a data portion. In process block 502, an update function 504 is identified, local data 506 are read, and a symbolic output 508 is produced for each of the three data points by applying the update function to the local data. Process block 502 can be an example part of performing symbolic SGD analysis. In FIG. 5, initial values for output model weights are initialized symbolically (w=[r,s], inter=[t].

FIG. 5 illustrates how a symbolic decision variable can change after processing each data point. For linear regression, a gradient approximation function is $$g(x_i, w) = x_i^T(x_i \cdot w - y) \qquad (2)$$

for a data point $x_i$ and decision vector w. The update function shown in FIG. 5 is based on this gradient approximation function in equation (2). In FIG. 5, there are three data points in a two-dimensional feature space. Instead of using a concrete vector w and scalar inter (interception), symbolic states are used to initialize the processing. This is done by using w=[r, s] and inter=[t], where r, s, t are three scalar variables. FIG. 5 shows the new "value" of w and inter after processing a data point ($x_i$, $y_i$).

Process block 510 illustrates an efficient representation of symbolic output 508 as a matrix-vector multiplication that includes a local model 512 (a local model shown for each data pair) in a vector representation and a model combiner 514 (a model combiner shown for each data pair) in a matrix representation. Local model 512 and model combiner 514 include only concrete values, but in other examples, local model 512 and model combiner 514 contain symbolic values as well. By deducing how local model 512 and model combiner 514 can be computed, symbols can be removed from the computation, and some matrix-vector libraries, such as BLAS (Basic Linear Algebra Subprograms) and LAPCK (Linear Algebra Package), for example, can be used to improve efficiency. Given a set of data points in the k-dimensional feature space, the matrix of interest to learn is be k+1 by k+1 in size, where the ith row demonstrate the linear combination of the k symbolic terms of w and one symbolic interception. Interception can be regarded as one special feature and, as a consequence, can be considered part of the decision variable w.

FIG. 6 illustrates a method 600 of parallelized SGD analysis (also referred to as parallel symbolic SGD) that uses the model combiner and local model as illustrated, for example, in FIG. 5. In process block 602, training data P is partitioned. Process block 604 is a "for" loop indicating that process blocks 606 and 608 are performed for the respective processors. In process block 606, the local model (w*$_j$) is initialized to zero, the model combiner (M$_j$) is initialized as the identity matrix, I, and process block 606 iteratively performs process block 608 for the respective individual machines. In process block 608, the coefficient matrix M and local decision vector w are iteratively computed based on $$w^*_j = w^*_j - a \times z_i^T(x_i \times w^*_j - y_i) \quad (3)$$

where a is the learning rate, and x and w are defined as with respect to FIG. 5, and $$M_j = M_j - a \times x_i^T(x_i \times M_j) \quad (4)$$

as shown in FIG. 6. In process block 610, results learned from the individual local machine are combined together using $$w_j = M_j w_{j-1} + w^*_j. \quad (5)$$

The final, global model is then provided in process block 612.

The following proof indicates that the described approaches, including method 600, yield similar results to sequential SGD. Equations (3) and (4) are denoted below as (3) and (4). The proof is as follows:

$$(3) \cdot w + (4) = M \cdot w + w^* \quad (6)$$

$$= M \cdot w - \alpha \cdot x_i^T(x_i \cdot M) \cdot w + w_l - \alpha \cdot x_i^T(x_i \cdot w^* - y) \quad (7)$$

$$= (M \cdot w + w^*) - \alpha \cdot x_i^T(x_i \cdot (M \cdot w + w^*) - y) \quad (8)$$

Substitute $w^\# = M \cdot w + w^*$, which is the formula in process block 610:

$$w^\# = w^\# - \alpha \cdot (x_i \cdot w^\# -) \quad (9)$$

where α is the learning rate, a predefined parameter used to control the convergence rate and convergence error.

Updating of $w^\#$ follows the same update rule as depicted in equation (5). M and w* can be initialized to ensure that for any $w_{initial}$, a suitable w can be picked so that $w^\# = M \cdot w + w^* = w_{initial}$, where $w_{initial}$ is the initial decision vector supplied to the sequential algorithm, then the same final $w_{final}$ is obtained.

Process block 606 indicates one possible way to initialize M and w*: setting M to identity matrix and w* to all zeros. And for any $w_{initial}$, $w = w_{initial}$ could be chosen, which satisfies $w^\# = M \cdot w + w^* = w_{initial}$. Another approach is to initialize w* to some vector $w_{guess}$, which is potentially close to $w_{initial}$ (M is still set to identity, for example). Similarly for any $w_{initial}$, $w = w_{initial} - w_{guess}$ could be used, which satisfies $w^\# = M \cdot w + w^* = w_{initial}$. Many additional initialization methods are also possible. In various examples, M is initialized to full rank.

There is another way to interpret what equations (3), (4), and (5) are calculating. In fact, equation (3) follows the same iterative rule as that shown in the update formula in process block 502 of FIG. 5. The difference is the starting point. And to mitigate the effect caused by difference of these two different initial points, and ensure restoration is possible for any real initial state, equation (4) uses a full rank matrix to efficiently learn how local data would affect any initial state. Equation (5) combines the result from equations (3) and (4) with the concrete initial state.

Another interesting thing is that with such matrix representation, the reason why different initial conditions converge to the same final result can be clearly understood. Suppose there are p machines, and on each local machine, M and w* are set to the identity matrix and an all-0s vector respectively for all local machines. The following equations result:

$$w_{final} = w_p = M_p \cdot w_{p-1} + w^*_p \quad (10)$$

$$= M_p \cdot (M_{p-1} \cdot w^*_{p-2} + w^*_{p-1}) + w^*_p \quad (11)$$

$$= \ldots$$

$$= \prod_{i=p}^{1} M_i \cdot w_{initial} + \prod_{i=p}^{2} M_i \cdot w^*_1 + \prod_{i=p}^{3} M_i \cdot w^*_2 + \ldots \quad (12)$$

$$\ldots + M_p \cdot w^*_{p-1} + w^*_p \quad (13)$$

When the data set is properly scaled, then largest eigenvalue of M would be less than 1. And the first term in the formula above would be very small. In other words, different $w_{initial}$ would not affect the final $w_{final}$ that would be learned.

Figure 7:
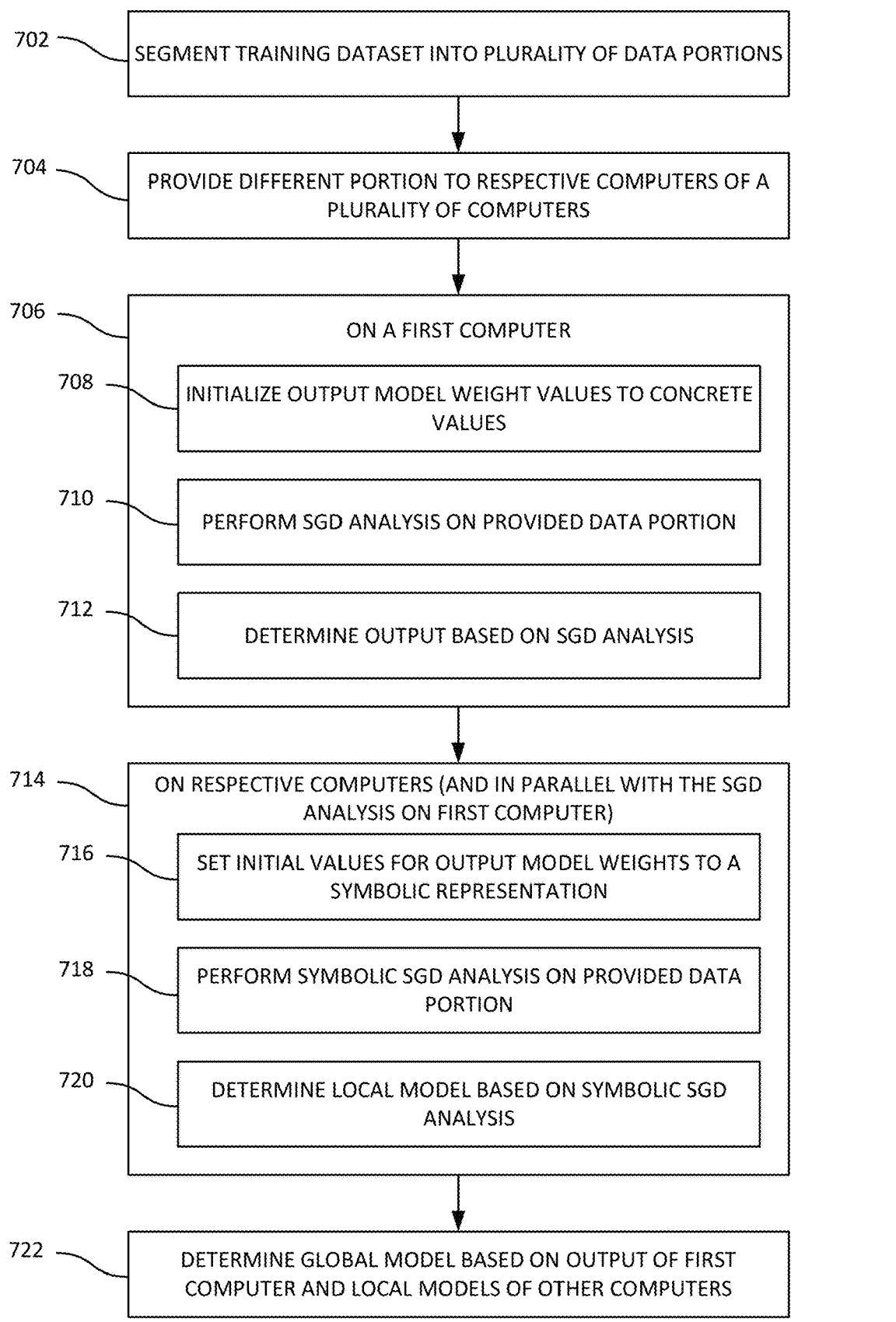
FIG. 7 is a flowchart of an example machine learning method.

FIG. 7 illustrates a method 700 for machine learning. In process block 702, a training dataset is segmented into a plurality of data portions. In process block 704, a different portion of the plurality of data portions is provided to respective computers of a plurality of computers. In process block 706, process blocks 708, 710, and 712 are performed on a first computer of the plurality of computers. In process block 708 values for a set of output model weights are initialized to concrete values. In process block 710, stochastic gradient descent (SGD) analysis is performed on a data portion of the plurality of data portions provided to the first computer. In process block 712, an output is determined for the data portion provided to the first computer based on the SGD analysis.

In process block 714, process blocks 716, 718, and 720 are performed on the respective computers of the plurality of computers and in parallel with the SGD analysis performed on the first computer. Initial values for a set of output model weights to a symbolic representation are set in process block 716. The output model weights correspond to the data portion provided to the computer. In process block 718, symbolic SGD analysis is performed on the data portion provided to the computer. In process block 720, a local model is determined based on the symbolic SGD analysis, the local model representing at least some of the output model weights for the data portion. A model combiner can also be determined. In process block 722, based on the output for the data portion provided to the first computer and the local models for the data portions provided to the respective computers of the plurality of computers, a global model reflecting the training dataset is determined. The global model can also be determined based on the model combiners.

Figure 8:
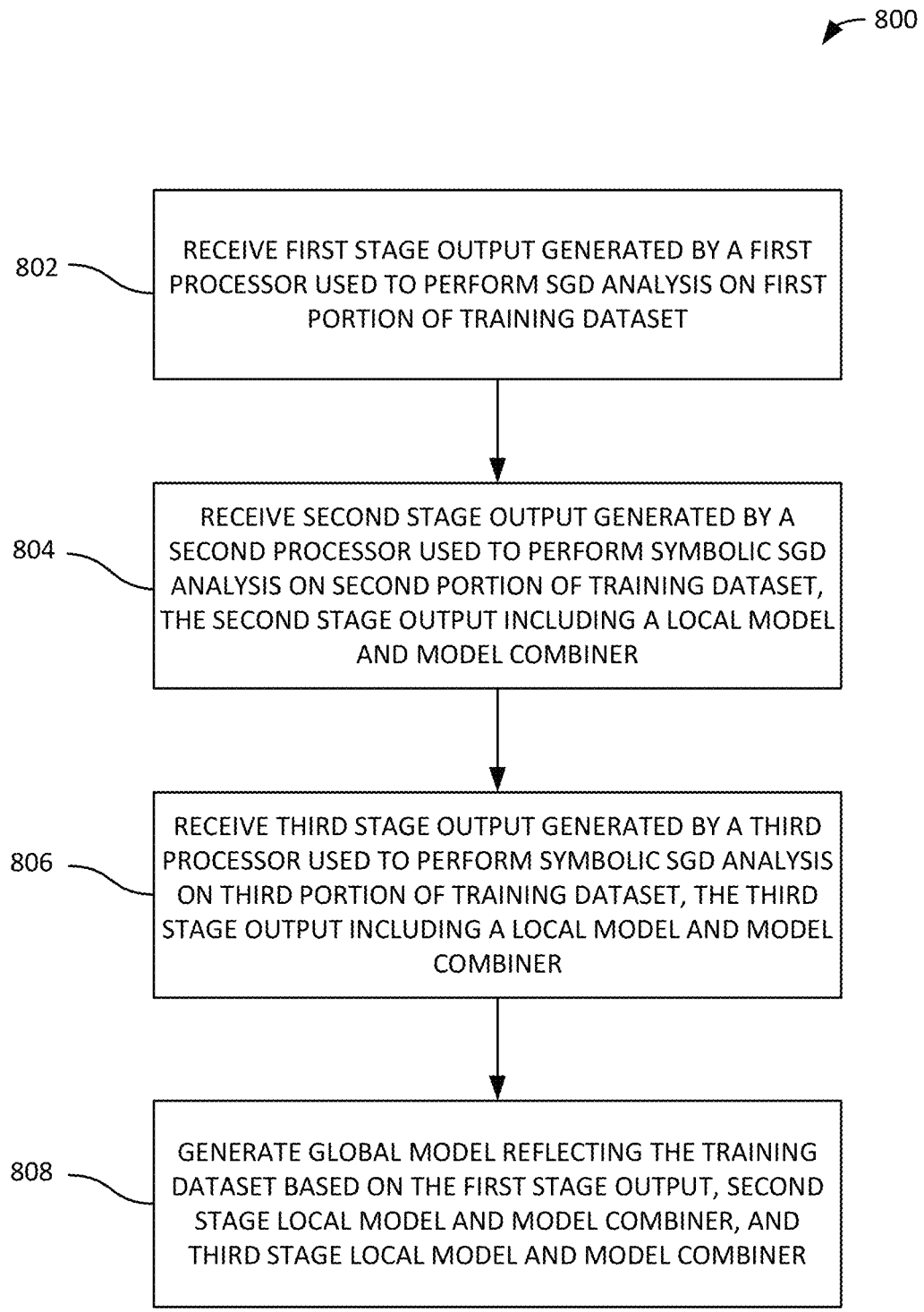
FIG. 8 is a flowchart of an example machine learning method in which outputs from multiple stages performing parallel symbolic SGD analysis are received and combined to generate a global model.

FIG. 8 illustrates a method 800 for machine learning. In process block 802, a first stage output is received. The first stage output is generated by a first processor used to perform stochastic gradient descent (SGD) analysis on a first portion of a training dataset. The first stage output comprises a set of output model weights for the first portion. In process block 804, a second stage output is received. The second stage output is generated by a second processor used to perform symbolic SGD analysis on a second portion of a training dataset. The symbolic SGD analysis comprises using a symbolic representation as an initial state of a set of output model weights for the second portion. The second stage output comprises a second stage local model for the second portion and a second stage model combiner for the second portion. The second stage local model and the second stage model combiner represent the set of output model weights for the second portion.

In process block 806, a third stage output is received. The third stage output is generated by a third processor used to perform symbolic SGD analysis on a third portion of a training dataset. The symbolic SGD analysis comprises using a symbolic representation as an initial state of a set of output model weights for the third portion. The third stage output comprises a third stage local model for the third portion and a third stage model combiner for the third portion. The third stage local model and the third stage model combiner represent the set of output model weights for the third portion. The first, second, and third stage outputs were generated in parallel by the first, second, and third processors, respectively. In process block 808, a global model reflecting the training dataset is generated based on the first stage output, the second stage local model, the second stage model combiner, the third stage local model, and the third stage model combiner.

Sparse Data Examples

If the data for learning is dense, then M is dense and has a size of k×k, where k is the number of features. When k gets larger, the space overhead for storing M and the computation overhead of calculating M are both potentially problematic. In general, however, when the number of features becomes larger, the data set also becomes sparse. Suppose k is the number of existing features for all data examples, and d is the averaged nonzero features for each example. Then it is common that d is much less than k when k gets large.

There are many reasons why real-world data is sparse. In machine learning instances with large numbers of features, not all input points contain all features. Further, many features often have the default values or categories.

Two properties of the sparsity of datasets can be used to "optimize" M (i.e., reduce storage space and computation time overhead). First, when all the datasets in a machine do not have a certain feature, then the matrix M projected on these missing features is an identity matrix. Specifically, the following theorem holds.

When a feature i does not appear on local machine p, then following proof can be shown:

$$w_{out}^p = M^p * w_{in}^p + w^p \qquad (14)$$

$$M^p[i][j]=0 \qquad (15)$$

$$M^p[i][i]=1 w^p[i] \qquad (16)$$

$$w_{out}[i]=w_{out}[i] \qquad (17)$$

This implies that M should only contain entries for features in the machine.

Second, as a corollary of this, if a particular feature is only present in one machine, then parts of M belonging to this feature need not be shared with other machines. Specifically, the following theorem holds. For one feature, i, that only appears on local machine p:

$$w_{final}[i]=w_p[i] \qquad (18)$$

is a corollary of the proof illustrated in equations (14)-(17).

Moreover, since a machine does not care about parts of M corresponding to features not in its dataset, a machine needs to only share parts of M that correspond to shared features. The shared features creates a "dependence" graph among machines. This further reduces the communication cost of sharing M across machines.

Example Computing Systems

Figure 9:
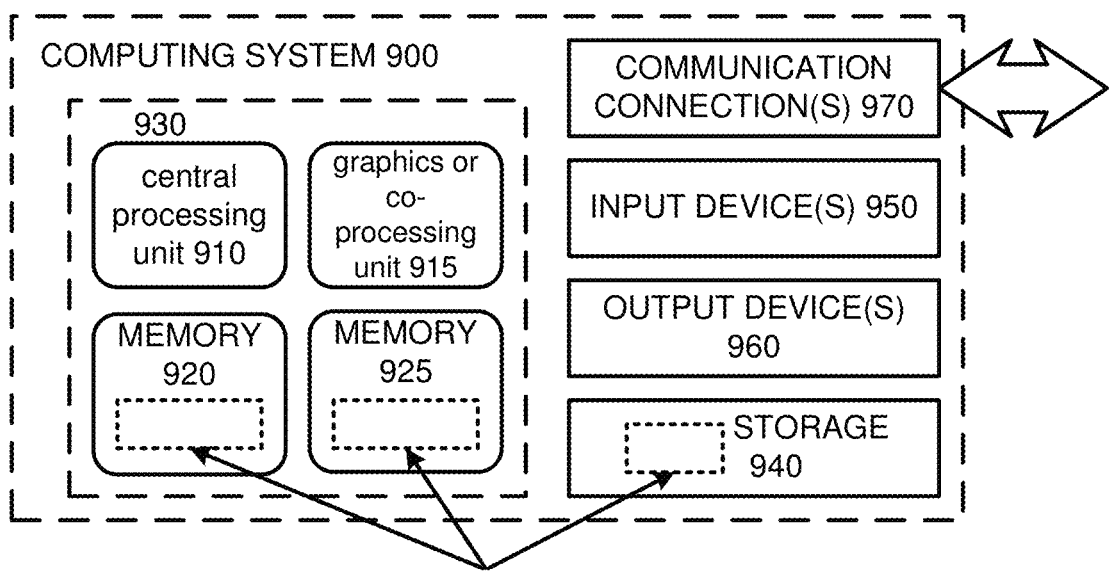
FIG. 9 is a diagram of an example computing system in which some described embodiments can be implemented.

FIG. 9 depicts a generalized example of a suitable computing system 900 in which the described innovations may be implemented. The computing system 900 is not intended to suggest any limitation as to scope of use or functionality, as the innovations may be implemented in diverse general-purpose or special-purpose computing systems.

With reference to FIG. 9, the computing system 900 includes one or more processing units 910, 915 and memory 920, 925. In FIG. 9, this basic configuration 930 is included within a dashed line. The processing units 910, 915 execute computer-executable instructions. A processing unit can be a general-purpose central processing unit (CPU), processor in an application-specific integrated circuit (ASIC), or any other type of processor. In a multi-processing system, multiple processing units execute computer-executable instructions to increase processing power. For example, FIG. 9 shows a central processing unit 910 as well as a graphics processing unit or co-processing unit 915. The tangible memory 920, 925 may be volatile memory (e.g., registers, cache, RAM), non-volatile memory (e.g., ROM, EEPROM, flash memory, etc.), or some combination of the two, accessible by the processing unit(s). The memory 920, 925 stores software 980 implementing one or more innovations described herein, in the form of computer-executable instructions suitable for execution by the processing unit(s). For example, memory 920, 925 can store: initial data portion analyzer 110, local model builder 112, and/or global model builder 114 of FIG. 1; initial data portion analyzer 210, local model builder 212, additional local model builder 214, and/or global model builder 228 of FIG. 2; and/or global model builder 310 of FIG. 3.

A computing system may have additional features. For example, the computing system 900 includes storage 940, one or more input devices 950, one or more output devices 960, and one or more communication connections 970. An interconnection mechanism (not shown) such as a bus, controller, or network interconnects the components of the computing system 900. Typically, operating system software (not shown) provides an operating environment for other software executing in the computing system 900, and coordinates activities of the components of the computing system 900.

The tangible storage 940 may be removable or non-removable, and includes magnetic disks, magnetic tapes or cassettes, CD-ROMs, DVDs, or any other medium which can be used to store information and which can be accessed within the computing system 900. The storage 940 stores instructions for the software 980 implementing one or more innovations described herein. For example, storage 940 can store: initial data portion analyzer 110, local model builder 112, and/or global model builder 114 of FIG. 1; initial data portion analyzer 210, local model builder 212, additional local model builder 214, and/or global model builder 228 of FIG. 2; and/or global model builder 310 of FIG. 3.

The input device(s) 950 may be a touch input device such as a keyboard, mouse, pen, or trackball, a voice input device, a scanning device, or another device that provides input to the computing system 900. For video encoding, the input device(s) 950 may be a camera, video card, TV tuner card, or similar device that accepts video input in analog or digital form, or a CD-ROM or CD-RW that reads video samples into the computing system 900. The output device(s) 960 may be a display, printer, speaker, CD-writer, or another device that provides output from the computing system 900.

The communication connection(s) 970 enable communication over a communication medium to another computing entity. The communication medium conveys information such as computer-executable instructions, audio or video input or output, or other data in a modulated data signal. A modulated data signal is a signal that has one or more of its characteristics set or changed in such a manner as to encode information in the signal. By way of example, and not limitation, communication media can use an electrical, optical, RF, or other carrier.

The innovations can be described in the general context of computer-executable instructions, such as those included in program modules, being executed in a computing system on a target real or virtual processor. Generally, program modules include routines, programs, libraries, objects, classes, components, data structures, etc. that perform particular tasks or implement particular abstract data types. The functionality of the program modules may be combined or split between program modules as desired in various embodiments. Computer-executable instructions for program modules may be executed within a local or distributed computing system.

The terms "system" and "device" are used interchangeably herein. Unless the context clearly indicates otherwise, neither term implies any limitation on a type of computing system or computing device. In general, a computing system or computing device can be local or distributed, and can include any combination of special-purpose hardware and/or general-purpose hardware with software implementing the functionality described herein.

For the sake of presentation, the detailed description uses terms like "determine" and "use" to describe computer operations in a computing system. These terms are high-level abstractions for operations performed by a computer, and should not be confused with acts performed by a human being. The actual computer operations corresponding to these terms vary depending on implementation.

Example Mobile Devices

Figure 10:
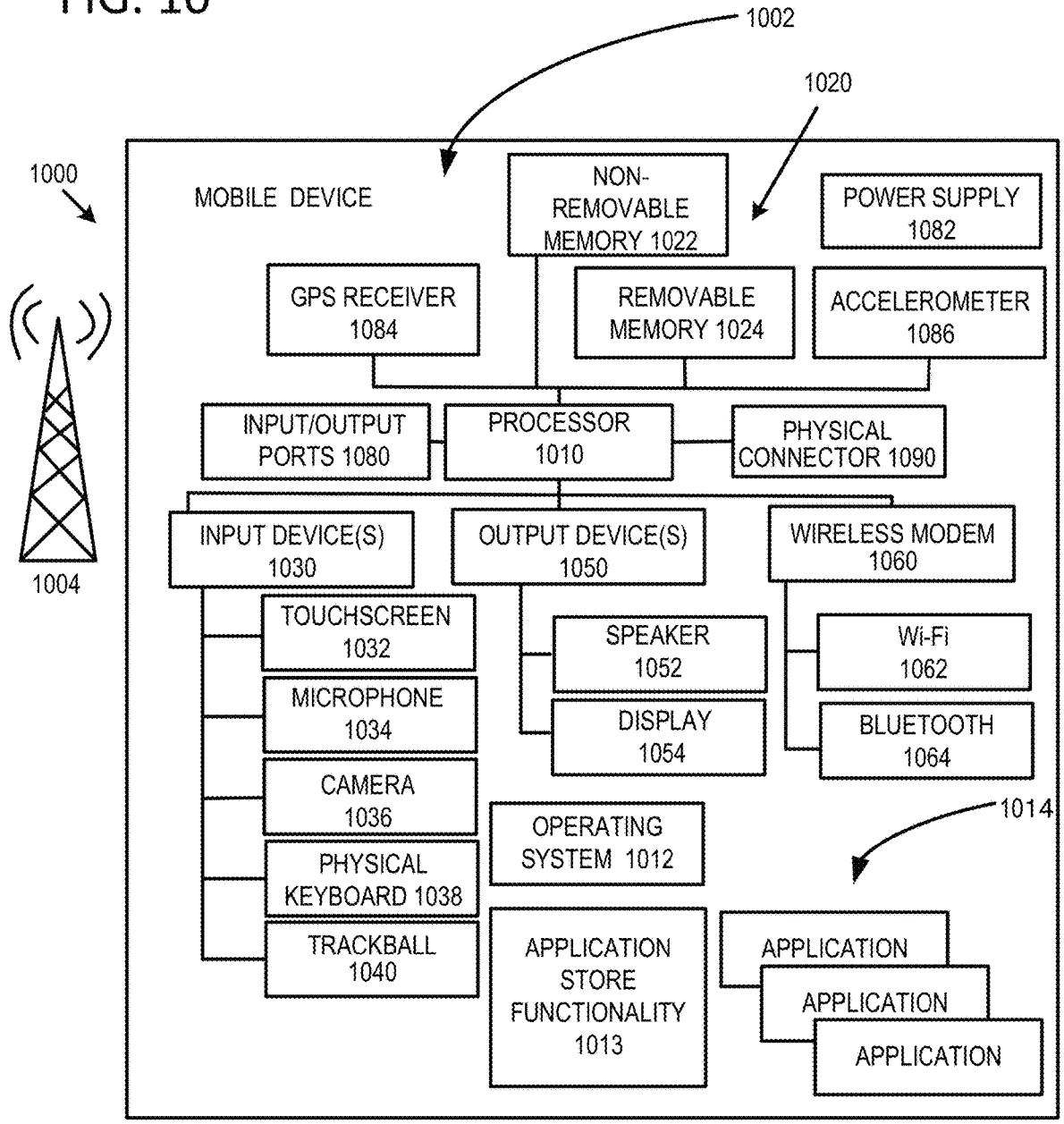
FIG. 10 is an example mobile device that can be used in conjunction with the technologies described herein.

FIG. 10 is a system diagram depicting an example mobile device 1000 including a variety of optional hardware and software components, shown generally at 1002. Any components 1002 in the mobile device can communicate with any other component, although not all connections are shown, for ease of illustration. The mobile device can be any of a variety of computing devices (e.g., cell phone, smartphone, handheld computer, Personal Digital Assistant (PDA), etc.) and can allow wireless two-way communications with one or more mobile communications networks 1004, such as a cellular, satellite, or other network.

The illustrated mobile device 1000 can include a controller or processor 1010 (e.g., signal processor, microprocessor, ASIC, or other control and processing logic circuitry) for performing such tasks as signal coding, data processing, input/output processing, power control, and/or other functions. An operating system 1012 can control the allocation and usage of the components 1002 and support for one or more application programs 1014. The application programs can include common mobile computing applications (e.g., email applications, calendars, contact managers, web browsers, messaging applications), or any other computing application. The application programs 1014 can also include machine learning technology using parallelized SGD analysis. Functionality 1013 for accessing an application store can also be used for acquiring and updating application programs 1014.

The illustrated mobile device 1000 can include memory 1020. Memory 1020 can include non-removable memory 1022 and/or removable memory 1024. The non-removable memory 1022 can include RAM, ROM, flash memory, a hard disk, or other well-known memory storage technologies. The removable memory 1024 can include flash memory or a Subscriber Identity Module (SIM) card, which is well known in GSM communication systems, or other well-known memory storage technologies, such as "smart cards." The memory 1020 can be used for storing data and/or code for running the operating system 1012 and the applications 1014. Example data can include web pages, text, images, sound files, video data, or other data sets to be sent to and/or received from one or more network servers or other devices via one or more wired or wireless networks. The memory 1020 can be used to store a subscriber identifier, such as an International Mobile Subscriber Identity (IMSI), and an equipment identifier, such as an International Mobile Equipment Identifier (IMEI). Such identifiers can be transmitted to a network server to identify users and equipment.

The mobile device 1000 can support one or more input devices 1030, such as a touchscreen 1032, microphone 1034, camera 1036, physical keyboard 1038 and/or trackball 940 and one or more output devices 1050, such as a speaker 1052 and a display 1054. Other possible output devices (not shown) can include piezoelectric or other haptic output devices. Some devices can serve more than one input/output function. For example, touchscreen 1032 and display 1054 can be combined in a single input/output device.

The input devices 1030 can include a Natural User Interface (NUI). An NUI is any interface technology that enables a user to interact with a device in a "natural" manner, free from artificial constraints imposed by input devices such as mice, keyboards, remote controls, and the like. Examples of NUI methods include those relying on speech recognition, touch and stylus recognition, gesture recognition both on screen and adjacent to the screen, air gestures, head and eye tracking, voice and speech, vision, touch, gestures, and machine intelligence. Other examples of a NUI include motion gesture detection using accelerometers/gyroscopes, facial recognition, 3D displays, head, eye, and gaze tracking, immersive augmented reality and virtual reality systems, all of which provide a more natural interface, as well as technologies for sensing brain activity using electric field sensing electrodes (EEG and related methods). Thus, in one specific example, the operating system 1012 or applications 1014 can comprise speech-recognition software as part of a voice user interface that allows a user to operate the device 1000 via voice commands. Further, the device 1000 can comprise input devices and software that allows for user interaction via a user's spatial gestures, such as detecting and interpreting gestures to provide input to a gaming application.

A wireless modem 1060 can be coupled to an antenna (not shown) and can support two-way communications between the processor 1010 and external devices, as is well understood in the art. The modem 1060 is shown generically and can include a cellular modem for communicating with the mobile communication network 1004 and/or other radio-based modems (e.g., Bluetooth 1064 or Wi-Fi 1062). The wireless modem 1060 is typically configured for communication with one or more cellular networks, such as a GSM network for data and voice communications within a single cellular network, between cellular networks, or between the mobile device and a public switched telephone network (PSTN).

The mobile device can further include at least one input/output port 1080, a power supply 1082, a satellite navigation system receiver 1084, such as a Global Positioning System (GPS) receiver, an accelerometer 1086, and/or a physical connector 1090, which can be a USB port, IEEE 1394 (FireWire) port, and/or RS-232 port. The illustrated components 1002 are not required or all-inclusive, as any components can be deleted and other components can be added.

Example Cloud-Supported Environments

Figure 11:
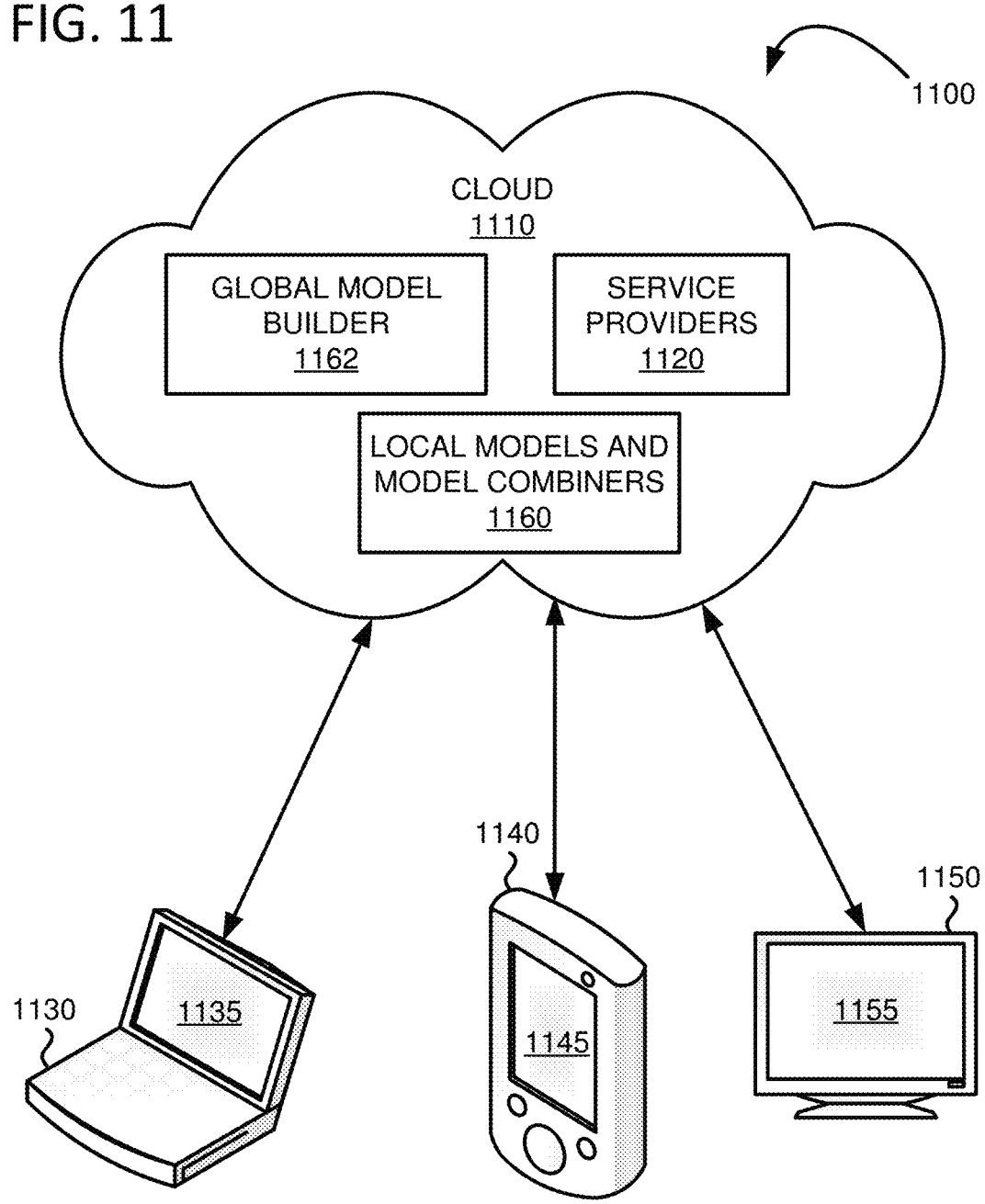
FIG. 11 is an example cloud-supported environment that can be used in conjunction with the technologies described herein.

FIG. 11 illustrates a generalized example of a suitable cloud-supported environment 1000 in which described embodiments, techniques, and technologies may be implemented. In the example environment 1100, various types of services (e.g., computing services) are provided by a cloud 1110. For example, the cloud 1110 can comprise a collection of computing devices, which may be located centrally or distributed, that provide cloud-based services to various types of users and devices connected via a network such as the Internet. The implementation environment 1100 can be used in different ways to accomplish computing tasks. For example, some tasks (e.g., processing user input and presenting a user interface) can be performed on local computing devices (e.g., connected devices 1130, 1140, 1150) while other tasks (e.g., storage of data to be used in subsequent processing) can be performed in the cloud 1110.

In example environment 1100, the cloud 1110 provides services for connected devices 1130, 1140, 1150 with a variety of screen capabilities. Connected device 1130 represents a device with a computer screen 1135 (e.g., a mid-size screen). For example, connected device 1130 can be a personal computer such as desktop computer, laptop, notebook, netbook, or the like. Connected device 1140 represents a device with a mobile device screen 1145 (e.g., a small size screen). For example, connected device 1140 can be a mobile phone, smart phone, personal digital assistant, tablet computer, and the like. Connected device 1150 represents a device with a large screen 1155. For example, connected device 1150 can be a television screen (e.g., a smart television) or another device connected to a television (e.g., a set-top box or gaming console) or the like. One or more of the connected devices 1130, 1140, 1150 can include touchscreen capabilities. Touchscreens can accept input in different ways. For example, capacitive touchscreens detect touch input when an object (e.g., a fingertip or stylus) distorts or interrupts an electrical current running across the surface. As another example, touchscreens can use optical sensors to detect touch input when beams from the optical sensors are interrupted. Physical contact with the surface of the screen is not necessary for input to be detected by some touchscreens. Devices without screen capabilities also can be used in example environment 1100. For example, the cloud 1110 can provide services for one or more computers (e.g., server computers) without displays.

Services can be provided by the cloud 1110 through service providers 1120, or through other providers of online services (not depicted). For example, cloud services can be customized to the screen size, display capability, and/or touchscreen capability of a particular connected device (e.g., connected devices 1130, 1140, 1150).

In example environment 1100, the cloud 1110 provides the technologies and solutions described herein to the various connected devices 1130, 1140, 1150 using, at least in part, the service providers 1120. For example, the service providers 1120 can provide a centralized solution for various cloud-based services. The service providers 1120 can manage service subscriptions for users and/or devices (e.g., for the connected devices 1130, 1140, 1150 and/or their respective users). The cloud 1110 can store local models and model combiners 1160 and a global model builder 1162.

Example Implementations

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods can be used in conjunction with other methods.

Any of the disclosed methods can be implemented as computer-executable instructions or a computer program product stored on one or more computer-readable storage media and executed on a computing device (e.g., any available computing device, including smart phones or other mobile devices that include computing hardware). Computer-readable storage media are any available tangible media that can be accessed within a computing environment (e.g., one or more optical media discs such as DVD or CD, volatile memory components (such as DRAM or SRAM), or nonvolatile memory components (such as flash memory or hard drives)). By way of example and with reference to FIG. 9, computer-readable storage media include memory 920 and 925, and storage 940. By way of example and with reference to FIG. 10, computer-readable storage media include memory and storage 1020, 1022, and 1024. The term computer-readable storage media does not include signals and carrier waves. In addition, the term computer-readable storage media does not include communication connections (e.g., 970, 1060, 1062, and 1064).

Any of the computer-executable instructions for implementing the disclosed techniques as well as any data created and used during implementation of the disclosed embodiments can be stored on one or more computer-readable storage media. The computer-executable instructions can be part of, for example, a dedicated software application or a software application that is accessed or downloaded via a web browser or other software application (such as a remote computing application). Such software can be executed, for example, on a single local computer (e.g., any suitable commercially available computer) or in a network environment (e.g., via the Internet, a wide-area network, a local-area network, a client-server network (such as a cloud computing network), or other such network) using one or more network computers.

For clarity, only certain selected aspects of the software-based implementations are described. Other details that are well known in the art are omitted. For example, it should be understood that the disclosed technology is not limited to any specific computer language or program. For instance, the disclosed technology can be implemented by software written in C++, Java, Perl, JavaScript, Adobe Flash, or any other suitable programming language. Likewise, the disclosed technology is not limited to any particular computer or type of hardware. Certain details of suitable computers and hardware are well known and need not be set forth in detail in this disclosure.

Furthermore, any of the software-based embodiments (comprising, for example, computer-executable instructions for causing a computer to perform any of the disclosed methods) can be uploaded, downloaded, or remotely accessed through a suitable communication means. Such suitable communication means include, for example, the Internet, the World Wide Web, an intranet, software applications, cable (including fiber optic cable), magnetic communications, electromagnetic communications (including RF, microwave, and infrared communications), electronic communications, or other such communication means.

The disclosed methods, apparatus, and systems should not be construed as limiting in any way. Instead, the present disclosure is directed toward all novel and nonobvious features and aspects of the various disclosed embodiments, alone and in various combinations and sub combinations with one another. The disclosed methods, apparatus, and systems are not limited to any specific aspect or feature or combination thereof, nor do the disclosed embodiments require that any one or more specific advantages be present or problems be solved.

The technologies from any example can be combined with the technologies described in any one or more of the other examples. In view of the many possible embodiments to which the principles of the disclosed technology may be applied, it should be recognized that the illustrated embodiments are examples of the disclosed technology and should not be taken as a limitation on the scope of the disclosed technology.

We claim:

1. A machine learning system, comprising:
    a first processor;
    a second processor;
    an initial data portion analyzer configured to perform, using the first processor, stochastic gradient descent (SGD) analysis on an initial portion of a training dataset, wherein the SGD analysis comprises initializing values for a set of output model weights for the initial portion of the training dataset;
    a local model builder configured to perform, using the second processor, symbolic SGD analysis on an additional, separate portion of the training dataset, wherein the symbolic SGD analysis comprises using a symbolic representation as an initial state of a set of output model weights for the additional, separate portion of the training dataset, and wherein the initial data portion analyzer and local model builder are configured to perform the SGD analysis and symbolic SGD analysis in parallel; and
    a global model builder configured to integrate an output of the local model builder, based on the symbolic SGD analysis using the symbolic representation as the initial state of output model weights for the additional, separate portion of the training dataset, and an output of the initial data portion analyzer, based on the SGD analysis using values for the set of output model weights for the initial portion of the training dataset, into a global model that reflects both the initial portion and the additional portion of the training dataset.

2. The system of claim 1, wherein the output of the local model builder comprises a local model representing the output model weights for the additional portion of the training dataset.

3. The system of claim 2, wherein the local model is a vector representation.

4. The system of claim 2, wherein the output of the local model builder further comprises a model combiner indicating how to combine the output from the initial data portion analyzer with the local model.

5. The system of claim 4, wherein the model combiner is a matrix representation.

6. The system of claim 1, wherein the global model is a linear model.

7. The system of claim 1, further comprising an additional local model builder, the additional local model builder being configured to perform, using a third processor, symbolic SGD analysis on a second additional, separate portion of the training dataset, and wherein the initial data portion analyzer, the local model builder, and the additional local model builder are configured to perform the SGD analysis and symbolic SGD analyses in parallel, and wherein the global model builder is configured to integrate an output of the additional local model builder into the global model.

8. The system of claim 7, wherein the first processor is part of a first server computer in a data center, the second processor is part of a second server computer in the data center, and the third processor is part of a third server computer in the data center.

9. The system of claim 1, further comprising a training data segmenter configured to: divide the training dataset into a plurality of portions, the plurality of portions including the initial, separate portion of the training dataset and the additional, separate portion of the training dataset; communicate the initial portion of the training dataset to the initial data portion analyzer; and communicate the additional, separate portion of the training dataset to the local model builder.

10. The system of claim 1, wherein the first processor is part of a first mobile device, the second processor is part of a second mobile device, and the global model builder is cloud-based.

11. The system of claim 1, wherein the global model includes values for a set of global output model weights.

12. The system of claim 1, wherein the SGD analysis and symbolic SGD analysis are linear regression analyses.

13. A method for machine learning, comprising:
    segmenting a training dataset into a plurality of data portions;
    providing a first data portion, of the plurality of data portions to a first computer, of a plurality of computers, and providing different data portions, of the plurality of data portions, to other respective computers of the plurality of computers;
    on the first computer of the plurality of computers:
        initializing values for a set of output model weights to concrete values;
        performing stochastic gradient descent (SGD) analysis on the first data portion of the plurality of data portions provided to the first computer; and
        determining an output for the first data portion provided to the first computer based on the SGD analysis;
    on the other respective computers of the plurality of computers and in parallel with the SGD analysis performed on the first computer:
        setting initial values for a set of output model weights to a symbolic representation, the output model weights corresponding to the different data portion provided to the other respective computer;
        performing symbolic SGD analysis on the different data portion provided to the other respective computer, based on the symbolic SGD analysis using the symbolic representation for the set of initial output model weights; and
        determining a local model, based on the symbolic SGD analysis, representing at least some of the output model weights for the different data portion; and based on the output for the first data portion provided to the first computer based on the SGD analysis and the local models for the different data portions provided to the other respective computers of the plurality of computers, based on the symbolic SGD analysis using the symbolic representation for the set of initial output model weights, determining a global model reflecting the training dataset.

14. The method of claim 13, further comprising, on the other respective computers of the plurality of computers, and in parallel with the SGD analysis performed on the first computer, determining a model combiner indicating how to combine the local model with at least one of (i) the output determined by the first computer or (ii) the local model from a different computer.

15. The method of claim 14, wherein the local model is a vector representation and the model combiner is a matrix representation.

16. The method of claim 14, wherein determining the local model comprises initializing the local model to a vector of all zeroes, and wherein determining the model combiner comprises initializing the model combiner as an identity matrix.

17. The method of claim 13, wherein the global model comprises values for a set of global output weights, and wherein determining the global model comprises combining (i) the local models and model combiners for the other respective computers and (ii) the output determined by the first computer.

18. The method of claim 13, wherein the local models and global model are linear models, and wherein the SGD analysis and symbolic SGD analysis are linear regression analyses.

19. One or more computer-readable storage media storing computer-executable instructions for machine learning, the machine learning comprising:

receiving a first stage output generated by a first processor used to perform stochastic gradient descent (SGD) analysis on a first portion of a training dataset, wherein the first stage output comprises a set of output model weights for the first portion;

receiving a second stage output generated by a second processor used to perform symbolic SGD analysis on a second, different portion of the training dataset, wherein the symbolic SGD analysis comprises using a symbolic representation as an initial state of a set of output model weights for the second portion, wherein the second stage output comprises a second stage local model for the second portion and a second stage model combiner for the second portion, and wherein the second stage local model and the second stage model combiner represent the set of output model weights for the second portion;

receiving a third stage output generated by a third processor used to perform symbolic SGD analysis on a third, different portion of the training dataset, wherein the symbolic SGD analysis comprises using a symbolic representation as an initial state of a set of output model weights for the third portion, wherein the third stage output comprises a third stage local model for the third portion and a third stage model combiner for the third portion, wherein the third stage local model and the third stage model combiner represent the set of output model weights for the third portion, and wherein the first, second, and third stage outputs were generated in parallel by the first, second, and third processors, respectively; and generating a global model reflecting the training dataset based on the first stage output, the second stage local model based on the symbolic representation as the initial state of the set of output model weights for the second portion, the second stage model combiner, the third stage local model based on the symbolic representation as the initial state of the set of output model weights for the third portion, and the third stage model combiner.

20. The one or more computer-readable storage media of claim 19, wherein the first processor is part of a first mobile computing device, the second processor is part of a second mobile computing device, and the third processor is part of a third mobile computing device.

* * * * *